United States Patent [19]
Mongon et al.

[11] Patent Number: 5,470,396
[45] Date of Patent: Nov. 28, 1995

[54] SOLAR CELL MODULE PACKAGE AND METHOD FOR ITS PREPARATION

[75] Inventors: John M. Mongon, Trenton, N.J.; Edward N. Twesme, Hatboro; Peggy A. Weiss, Pennsburg, both of Pa.

[73] Assignee: Amoco Corporation, Chicago, Ill.

[21] Appl. No.: 226,673

[22] Filed: Apr. 12, 1994

[51] Int. Cl.$^6$ .................... H01L 31/048; H01L 31/18
[52] U.S. Cl. .................... 136/251; 136/259; 257/433; 437/209
[58] Field of Search .................... 136/251, 259; 257/433–434; 437/207, 209, 211

[56] References Cited

U.S. PATENT DOCUMENTS

| | | | |
|---|---|---|---|
| 4,170,507 | 10/1979 | Keeling et al. | 156/245 |
| 4,231,807 | 11/1980 | Keeling et al. | 136/251 |
| 4,233,085 | 11/1980 | Roderick et al. | 136/244 |
| 4,633,032 | 12/1986 | Oido et al. | 136/251 |
| 4,953,577 | 9/1990 | Marshall | 136/251 |

FOREIGN PATENT DOCUMENTS 61-40066  2/1986  Japan .................... 136/251

OTHER PUBLICATIONS

Clifford, Lewis F., "The New Look of Automotive Coatings", *Materials Engineering* (Penton Publishing Co., Cleveland, Ohio), Oct., 1987, pp. 41–45.

*Primary Examiner*—Aaron Weisstuch
*Attorney, Agent, or Firm*—Thomas W. Tolpin

[57] ABSTRACT

A solar cell module package having improved resistance to mechanical breakage and environmental stress has a layer of asphaltic material interposed between a support member and one or a plurality of solar cells affixed to a first support member. Resistance to environmental stress is further increased by including a barrier coating between the one or plurality of solar cells and the layer of asphaltic material. A method is provided for the preparation of the solar cell module package which includes interposing a layer of asphaltic material between a support member and one or a plurality of solar cells and curing the layer assembled with the module.

13 Claims, 1 Drawing Sheet

SOLAR CELL MODULE PACKAGE AND METHOD FOR ITS PREPARATION

BACKGROUND OF THE INVENTION

1. Field of the Invention

The present invention relates to solar cell module packages and methods for their preparation, and, more particularly, to an improved solar cell module package having increased resistance to breakage, environmental elements or stress and undesirable leakage currents, and a method for its preparation.

2. Description of Related Art

Solar cell modules commonly include a first or top supporting member, which is preferably transparent to light, such as a glass plate, one or more solar cell elements affixed to one surface of the supporting member, which solar cell element or elements may include a conductive layer, preferably a thin conductive layer, for example a layer of tin oxide, on one surface thereof in contact with the supporting member, with the solar cell elements fabricated onto the thin conductive layer, and finally a second thin conductive layer, preferably a metal layer, such as aluminum, to form a conductive backing to the solar cell. An aluminum plate may be provided as a mounting support for the solar cell module. Such modules, comprised of these solar cell elements, while functional under ideal conditions, deteriorate in less than ideal conditions, for example, in the presence of mechanical or environmental stress, caused by heat and cold, cycling between heat and cold, and moisture, particularly humidity, as solar cell modules are often utilized outdoors and frequently in remote locations in harsh climates.

Various improvements to solar cell modules have been attempted, particularly to improve its electrical properties and its resistance to deterioration from various conditions as noted above. One attempted improvement intended for use in modules having an array of solar cell elements spaced from the top supporting member and from the second or back member, is to encapsulate the array with a potting material which places a compressive load on the array and the back member, as in U.S. Pat. No. 4,170,507. Another proposal is to provide an edge seal and a metal bezel in conjunction with potting material providing the compressive load between a cell array and a spaced back plate, as in U.S. Pat. No. 4,231,807. A third proposal, as set forth in U.S. Pat. No. 4,633,032 is to have the back plate spaced from the solar cell element formed on a glass substrate to define a space, to employ a layer of desiccant positioned on the back plate and facing that space, and to have a frame connecting the glass substrate and the back plate at their peripheral portions.

An improvement to solar cell modules to protect the exposed side of the solar cell elements, i.e. the side opposite its surface in contact with the glass or other first supporting member, is to form a thin covering layer on the exposed side, known as encapsulant or barrier coating. One such barrier coating, formed from a mixture of a two-component fluorinated polyurethane with a silane compound, is taught in U.S. Pat. No. 4,953,577.

While these attempts have been proposed, none has been fully satisfactory in solving the problems of protecting the module against physical breakage as well as electrical breakdowns. Therefore, there is a need for a solar cell module package which provides increased resistance to mechanical breakage as well as to deterioration in electrical properties due to humidity, heat, cold and cycling between such conditions and due to moisture.

SUMMARY OF THE INVENTION

Hence, it is one object of the present invention to provide an improved solar cell module package having increased resistance to mechanical breakage.

It is another object of the present invention to provide an improved solar cell module package with resistance to environmental stress as well as increased resistance to mechanical breakage.

Still another object of the present invention is to provide an improved solar cell module package which is resistant to undesirable leakage currents.

It is a further object of the present invention to provide a method of preparing an improved solar cell module package which is resistant to mechanical breakage, environmental stress and undesirable current leakage.

These and other objects and advantages of the present invention will be apparent from the following description.

In accordance with the present invention, an improved solar cell module package is provided which has increased resistance to mechanical breakage, environmental stress and undesirable current leakage. The package comprises a first support member, one or a plurality of solar cell elements affixed to the first support member, a layer of barrier or encapsulant material positioned in contact with the one or plurality of solar cell elements opposite the surface thereof affixed to the first support member, a layer of asphaltic material positioned at least closely adjacent the layer of barrier or encapsulant material in contact with the one or plurality of solar cell elements, and a second support member positioned closely adjacent the layer of asphaltic material.

The first support member is preferably transparent to light so as to allow light rays to reach the solar cell elements. A thin, transparent conductive layer, for example a layer of tin oxide formed on the transparent first support member, serves as a conductive surface against which the solar cell elements can be positioned. The solar cell element or elements are desirably formed on the first support member, for example, by deposition, such as glow discharge, sputtering or chemical vapor deposition onto the support. The deposited material may then be treated in a manner known to the art to form the solar cell element or a plurality of elements. The plurality of elements may be prepared from a single deposited structure by isolating cell elements therefrom by cutting isolating grooves or trenches into the structure.

The layer of asphaltic material utilized in the present invention is substantially coextensive with the surface of the one or plurality of solar cell elements and the barrier or encapsulant layer, and can be a coating of asphalt applied to the exposed surface of the solar cell element or the plurality of elements affixed to the first support member. More preferably, the layer of asphaltic material is a pre-prepared asphalt product which may be a sheet or web of material, such as a polymeric sheet or web, which has been coated with asphalt, particularly petroleum derived asphalt. A particularly preferred form of the layer of asphalt material for use in the present invention is a commercially available material known as asphalt sheet, which is a web or mesh of a polymeric material with asphalt coated into its interstices and onto its surfaces. The asphalt sheet is desirably placed against the exposed solar cell element surface. The preferred asphalt sheet has an adherent surface, that is a surface which is sticky or tacky, and is positioned with the adherent surface against the barrier or encapsulant layer which is in contact with the solar cell element or plurality of elements.

The layer of asphaltic material, in accordance with the present invention, provides increased resistance to breakage and deterioration in electrical properties, as will be hereinafter described.

As heretofore noted, it is preferred in the package of the present invention to include a barrier or encapsulant coating (hereinafter referred to as a "barrier coating") positioned on the surface of the solar cell element or elements opposite its surface thereof, affixed to the first support member, and to position the layer of asphaltic material at least closely adjacent the barrier coating, and preferably against the barrier coating. In the case where the layer of asphaltic material has an adherent surface, the layer is positioned with the adherent layer against the barrier coating. The use of the barrier layer in U.S. Pat. No. 4,953,577, provides additional protection to the module package against degradation by corrosion caused by environmental conditions.

The second support member can be of any material which will lend strength and relative rigidity to the module. Preferably the second support member is a metal plate or sheet, and more preferably is an aluminum plate at least substantially coextensive with the layer of asphaltic material. The second support member has marginal edges extending beyond the edges of the first support member, the solar cell elements and the layer of asphaltic material for a purpose to be hereinafter described.

In a preferred package of the present invention, frame means are provided at least along two sides of the module for loosely retaining the components in place relative to at least one of the support members. The frame means, which can be a pair of elongated metal clips, substantially holds the module together while allowing the components to expand and/or contract, and even become flexible, as required, during heating, cooling or cycling therebetween. The layer of asphaltic material, positioned closely adjacent, and preferably against the barrier layer which is in contact with the solar cell element or elements, protects the cell element or elements from exposure to environmental elements (for example, wind, rain, snow, sleet, etc. and radiation from the sun reaching the barrier layer and the surface of the solar cell elements opposite its surface in contact with or adjacent to the first support member), and the deterioration which commonly occurs from such exposure. The frame means can be secured to one of either the first support member or the second support member, or both, but preferably is secured to the second support member where the first support member is glass and the second support member is a metal plate, such as an aluminum plate. In the preferred package where glass is the first support member, it is further preferred that the frame means permit the glass to loosely fit, so the glass will not be stressed upon the frame means and/or the second support member expanding or contracting when heat or cold is encountered in the environment in which the package is utilized or stored.

The method of the present invention for preparing the improved solar cell module package can be performed by providing one or a plurality of solar cell elements affixed at one surface to a first support member, supporting the opposite surface of the one or plurality of solar cell elements by a second support member, interposing a barrier layer and a layer of asphaltic material between the one or plurality of solar cell elements and the second support member, and curing the package. The curing step of the method can be performed by heating the package at a temperature above about 60° C. and below about 150° C. for a time sufficient to at least soften the layer of asphaltic material so that it flows and provides contact and adhesion to the barrier coating and with the latter provides a seal for the solar cell elements against elements of the environment, i.e. rain, snow, sleet, cold, heat and solar radiation, also referred to as environmental stress. As heretofore described, the preferred layer of asphaltic material is an asphalt sheet, and when interposed in the method of the present invention, it has been found that the package is satisfactorily cured by heating the package at a temperature in the range described above for approximately 15 minutes.

As noted above, the method of the present invention preferably includes placing a barrier coating on the surface of the one or plurality of solar cell elements opposite the surface thereof affixed to the first support member prior to interposing the layer of asphaltic material and prior to the curing step. The method can also include providing the layer of asphaltic material with an adherent surface, such as a tacky surface, and placing the adherent surface against the solar cell element or plurality of solar cell elements, or against the barrier coating if present thereon, to form a seal therewith. It is also preferred in the method of the present invention, to use, as the layer of asphaltic material being interposed, a web of polymeric material supporting asphalt, and more preferably a mesh of polymeric material having asphalt in the interstices and on the surfaces of the mesh.

The method of the present invention further preferably includes providing frame means for substantially holding the components in place while allowing the components to expand and/or contract without causing undue stress. Preferably a metallic frame in the form of a pair of elongated metal clips are provided and the method further includes securing the clips to the second support member so as to substantially secure opposed side edges of the first support member, opposed side edges of the one or the plurality of solar cell elements, opposed side edges of the barrier coating if present, and opposed side edges of the layer of asphaltic material. The preferred method just described is facilitated where each of the components whose side edges are to be substantially retained are provided so as to be substantially coextensive with the first support member, the second support is provided with marginal edge portions extending beyond the edges of the first support member, and the clips are secured to the marginal edge portions.

The package of the present invention, provided by the method of the invention thus described, provides increased resistance to breakage, particularly in the case of thin film modules and using glass as the first support member, than provided by the previously known module packages. In this regard, the use of the layer of asphaltic material with a metal second support member, even using an aluminum plate as thin as ⅛ inch or 1/16 inch or less as the second support member, inhibits breakage of a glass first support member and solar cell elements fabricated thereon which otherwise results from twisting of the module and from side impacts thereto. The metal second support member and the layer of asphaltic material provide increased protection against environmental elements, and both protect the underside of the solar cell element or elements and barrier layer from degradation due to ultraviolet radiation, while the layer of asphaltic material protects the cell or cells from water ingress and thermal stresses. In addition, the layer of asphaltic material provides an electrical insulating as well as a cushioning medium to the rear or bottom of the cell element or cell elements. The metal second support can be utilized as a grounding means connected to an earth ground, so any unwanted current leakage could be conducted to ground.

The present invention will be more fully understood from the accompanying drawing which is to be read in conjunction with the description of the preferred embodiment, both showing and describing for illustration, a solar cell module package of the invention and a method for its preparation.

DESCRIPTION OF THE PREFERRED EMBODIMENT

Figure 1:
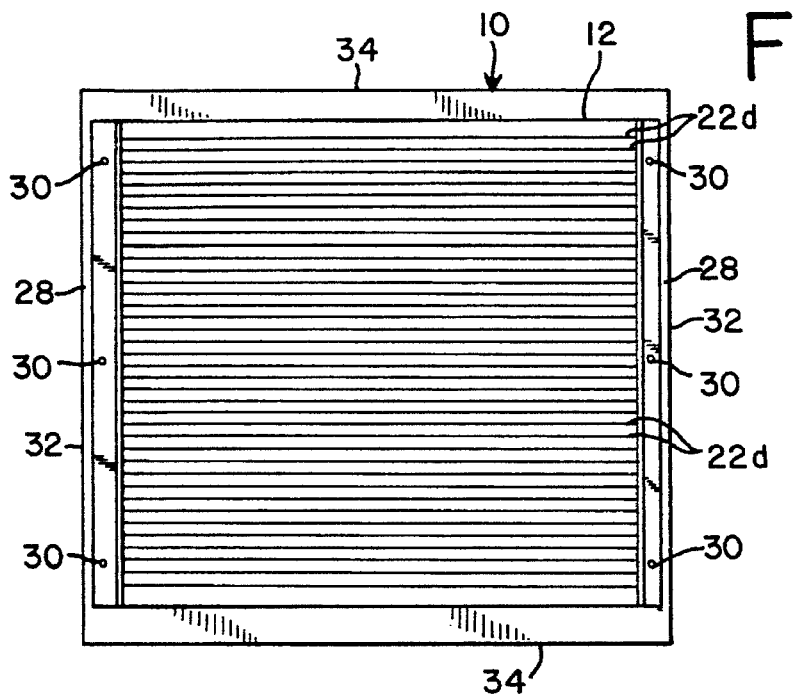
FIG. 1 is a top view of an embodiment of a solar cell module package in accordance with the present invention.

The preferred embodiment of the solar cell module package of the present invention will now be described with reference to the schematic illustrations in FIGS. 1 and 2, reference numeral 10 referring to the package.

In the preferred embodiment, solar cell module package 10 includes a glass plate 12 as the first support member having a photovoltaic or solar cell assembly 14 comprising one solar cell or a plurality of solar cells affixed to plate 12, a layer of asphaltic material 16 positioned at least closely adjacent solar cell assembly 14, and a second support member 18, which preferably is a metal plate as will be hereinafter described, positioned closely adjacent layer of asphaltic material 16.

Figure 3:
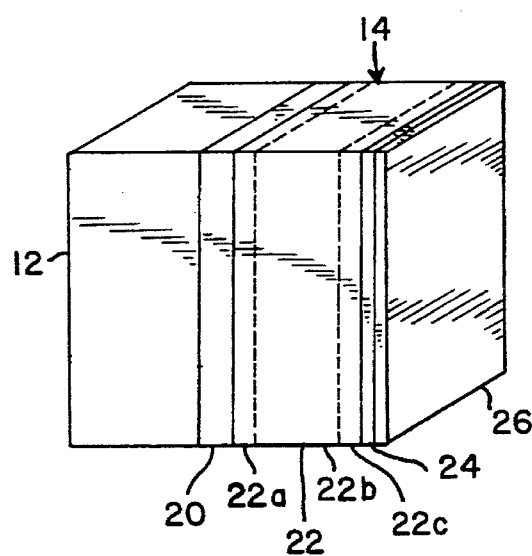
FIG. 3 is an illustration of a solar cell assembly useful in the module package of the present invention.

The preferred solar cell assembly 14, illustrated schematically in FIG. 3 (which is not drawn to scale), which is affixed to the glass plate 12 which serves as the first support member of the module package, includes a conductive layer 20 of, for example, tin oxide, which is preferably deposited on plate 12; one or plurality of solar cells in region 22, which may be fabricated on layer 20, for example by deposition of an amorphous silicon alloy film; and a back contact layer 24 of, for example, aluminum, zinc oxide, silver, etc. formed by, for example, metal deposition, on the surface of the alloy film, in the manner known to those in the art. The particular assembly 14 shown schematically in FIG. 3 includes p-i-n solar cells which are operable by light entering through transparent glass plate 12, through the conductive tin oxide layer 20 and into the amorphous silicon region 22. The amorphous silicon region 22 is a p-i-n junction, i.e. the region 22 includes a p type doped layer 22a, an intrinsic (i-) layer 22b, and a negatively doped layer 22c. The back conductive layer 24, together with the conductive layer 20, with suitable leads (not shown) attached, can conduct potential generated in the region 22 from the module to suitable collecting or storing apparatus or to a load to be operated thereby.

Figure 2:
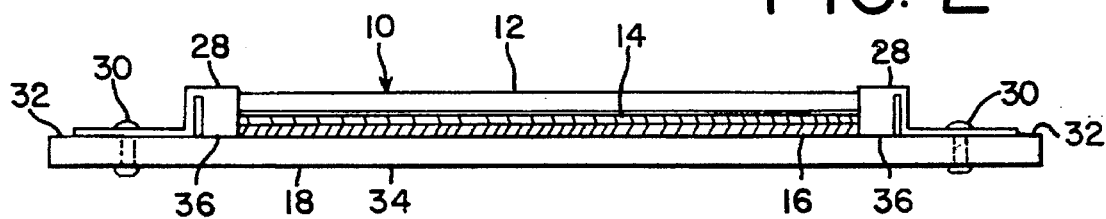
FIG. 2 is an enlarged front elevational view of the package as illustrated in FIG. 1.

In the illustration in the drawing, FIG. 1, the amorphous silicon region 22 further includes individual segment boundaries 22d, which separate rows of solar cells, as seen in FIG. 1 through plate 12, which may be rows of individual solar cells connected in series.

Assembly 14 in this embodiment further includes a thin barrier coating 26 of the type described in U.S. Pat. No. 4,953,577, applied, for example, by being sprayed onto the back contact layer 24 by the apparatus and method noted in the patent. Barrier coating 26 may be in the range of 0.002 inch thick and is coextensive with the assembly 14 on which it is applied.

Layer of asphaltic material 16 can be a layer of asphalt, i.e. the petroleum by-product or naturally occurring bitumen, preferably as a solid or high softening point material, positioned against assembly 14, i.e. against the solar cell or plurality of cells, and preferably against the back contact layer 24 and a barrier coating 26 if present. It is preferred to utilize a preformed asphalt sheet, such as a web of polymeric material coated with asphalt or a mesh of polymeric material having asphalt coated into the interstices and on the surfaces of the web or mesh, as the layer 16. A commercially available asphalt sheet which has been found to be useful as the layer 16, is marketed as DRIVEWAY MEDIC, which is distributed by Phillips Fiber Corporation, Greenville, S.C., U.S.A., which has one surface having an adherent surface, i.e. a sticky or tacky surface. DRIVEWAY MEDIC is a trademark of Phillips Fiber Corporation. It is preferred to place the adherent surface against barrier coating 26 in the preferred embodiment, and to have the layer 16 substantially coextensive with the glass plate 12, assembly 14 and the barrier coating 26.

The module package of the present embodiment further includes a second support member 18, which can be any structurally supporting material, but which preferably is a metal plate, such as an aluminum plate. Although the plate may be of any desired thickness in order to provide a degree of rigidity to the package, it is preferred to employ an aluminum plate in the range of ⅛ or 1/16 inch to maintain substantial rigidity to the package, while providing a light-weight and relatively flexible structure.

It is preferred to position member 18 closely adjacent layer 16 to provide protection from environmental elements for the surface of layer 16 opposite its surface in contact with assembly 14. However, member 18 should not be affixed or secured to layer 16 or assembly 14, but should be allowed to expand and contract relatively independent of the latter in view of the different coefficients of expansion of second support member 18, particularly when it is a metal plate, such as an aluminum plate, and glass plate 12 on which assembly 14 desirably has been fabricated. For this purpose, and to maintain the components of the module package described above in position, it is preferred to include frame means, which in the embodiment illustrated in FIGS. 1 and 2, is a pair of elongated metal clips 28 secured to second support member 18 by suitable fasteners, such as rivets 30 or screws or nuts and bolt combinations (not shown), or by welding or other means. To provide for a mounting surface for clips 28 on second support member 18 and, further, to provide for the mounting of package 10, second support member 18 preferably has a larger area than the other components of package 10. As illustrated, second support member 18 is provided with marginal edge portions 32 and 34 which extend beyond the edges of glass plate 12, assembly 14, and layer 16, all of which are preferably coextensive in area with each other. Clips 28 are secured by rivets 30 to marginal edge portions 32, and include end clip portions or flaps 36 which retain plate 12, assembly 14 and layer 16 against movement relative to second support member 18 in a direction parallel to the direction of elongation of clips 28.

The preferred embodiment of the method of the present invention for preparing solar cell module package 10 includes obtaining an assembly 14 of one or a plurality of solar cells on a first support member 12, for example by forming a thin conductive layer 20 of tin oxide on a glass plate 12 by depositing the layer on one surface of the plate; fabricating one or a plurality of solar cells on layer 20, for example by depositing an amorphous silicon alloy film on layer 20, and preparing the cell or cells from the alloy film in a manner known in the art; depositing a back conductive layer 24, as heretofore described on the exposed surface of assembly 14, and a barrier coating 26, also as heretofore described, on the back conductive coating 24.

The method of the preferred embodiment further includes providing a second support member 18 in the form of an aluminum plate to support the surface of assembly 14 opposite glass plate 12, i.e. back conductive layer 24; interposing a sheet of DRIVEWAY MEDIC as the layer of asphaltic material 16, which has been trimmed 20 to be coextensive with assembly 14, with the adherent or tacky surface of the sheet positioned against barrier coating 26. The layer of asphaltic material is then cured by heating the thus assembled components to a temperature of approximately 80° C. for 15 minutes. The method is completed by securing metal clips 28 by means of rivets 30 to loosely support glass plate 12, solar cell assembly 14 and layer 16 on aluminum plate second support member 18 so that the plate 12, assembly 14 and layer 16 relatively floats on support member 18.

The solar cell module package thus described is more resistant to breakage, for example upon accidental dropping, than packaged modules heretofore known in the art. The second support member 18 is believed to inhibit breakage of the glass plate 12 and the solar cell assembly which would frequently result from twisting of the solar cell module and from side impacts to the module, the layer of asphaltic material 16 absorbing some of the impact. The loose support or floating of the glass plate 12, assembly 14 and layer 16 on the second support 18 allows the module to expand and contract at different rates and to different extents, for example during thermal cycling under various commonly acquired climatic conditions, such as temperatures ranging between about −40° C. and 90° C., without the glass plate 12 and the components affixed thereto shattering due to internal stresses. The layer of asphaltic material 16 and the second support member 18 are believed to protect the module from environmental stresses, including rain, hail, moisture, and to protect the underside of assembly 14 from harmful degradation due to ultraviolet radiation. It is believed that the layer 16, and particularly the combination of barrier coating 26 and layer 16, provide a moisture vapor barrier for the solar cell assembly 14. Layer 16 also provides an electrical insulating medium, which is in addition to barrier coating 26, if present. As heretofore noted, the metal second support member 18 can be used as an integral ground to provide a connection to an earth ground, since substantially all of the underside of the module is adjacent member 18, and thus any unwanted leakage potential would be conducted to member 18 and then to earth ground. Clips 28, being of metal, would also conduct any unwanted leakage potential to member 18 and to ground since some tin oxide is known to be deposited on the edges of glass plate 12 during deposition of layer 20 on the latter, and the tin oxide on the edges of plate 12 would conduct such potential through clips 28 and member 18 to earth ground.

ELECTRICAL TESTING EXAMPLE

A module package with a region 22 of solar cells measuring 12 inches by 13 inches, prepared in accordance with the preferred embodiment heretofore described, was labeled as Plate 2. A second module, labeled as Plate 1, without a layer of asphaltic material and without a barrier coating, was prepared; and a third module, labeled as Plate 3, with a barrier coating but without a layer of asphaltic material was similarly prepared. Each module, (in the case of Plate 2—the module package) was mounted on a wood sheet, and the aluminum plate support member was grounded for high voltage protection. A series of isolation scribes or trenches were made in each module across its width to assist in measuring the resistance to electrical breakdown of the package according to the following pattern, each scribe was 0.004 inch wide, except as noted:

(1) one scribe
(2) two scribes, first scribe 0.25 inch from (1).
(3) three scribes, first scribe 0.25 inch from (2).
(4) four scribes, first scribe 0.25 inch from (3).
(5) five scribes, first scribe 0.25 inch from (4).
(6) one scribe, double the width of (1), one inch from fifth scribe of (5).
(7) one scribe, triple the width of (1), 0.25 inch from (6).
(8) one scribe, four times the width of (1), 0.25 inch from (7).
(9) one scribe, five times the width of (1), 0.25 inch from (8).
(10) one scribe, one inch from (9).
(11) two scribes, 0.25 inch from (10).
(12) three scribes, 0.25 inch from (11).
(13) four scribes, 0.25 inch from (12).
(14) five scribes, 0.25 inch from (13).

The module packages labeled as Plates 2 and 3 were subjected to 35 cycles of 85° C. and 85% humidity with cooling between cycles. The three module packages were then subjected to increasing D.C. voltages up to 2250 volts for 60 seconds applied by probes directly across the scribe or scribes at three different lengths as will be noted, with one probe above the scribe and the other probe beneath the scribe. The current was measured and the breakdown voltage, less than 2250 volts, if reached, was determined upon the current measured across the scribe or scribes reaching 50 µA. The breakdown voltages, if less than 2250 volts, were found as noted in the following table:

| Location of Probes Along Scribe(s) | BREAKDOWN VOLTAGE, VOLTS D.C. Scribe(s) No. | | | | | | | | | | | | | |
|---|---|---|---|---|---|---|---|---|---|---|---|---|---|---|
| Inches | 1 | 2 | 3 | 4 | 5 | 6 | 7 | 8 | 9 | 10 | 11 | 12 | 13 | 14 |
| Plate 1 | | | | | | | | | | | | | | |
| 4 | 600 | 1100 | 1000 | 1000 | 950 | 700 | 850 | 900 | 900 | 650 | 800 | 1300 | 900 | 1400 |
| 8 | 700 | 800 | 1100 | 1000 | 1400 | 700 | 300 | 1300 | 1100 | 700 | 900 | 1200 | 1300 | 1400 |
| 12 | 900 | 900 | 1100 | 1100 | 1400 | 1000 | 1200 | 1300 | 1300 | 1000 | 1700 | 1300 | 1400 | 1100 |
| Plate 2 | | | | | | | | | | | | | | |

-continued

BREAKDOWN VOLTAGE, VOLTS D.C.

| Location of Probes Along Scribe(s) | Scribe(s) No. | | | | | | | | | | | | | |
| --- | --- | --- | --- | --- | --- | --- | --- | --- | --- | --- | --- | --- | --- | --- |
| Inches | 1 | 2 | 3 | 4 | 5 | 6 | 7 | 8 | 9 | 10 | 11 | 12 | 13 | 14 |
| 4 | 2250 | 2250 | 2250 | 2250 | 2250 | 2250 | 2250 | 2250 | 2250 | 2250 | 2250 | 2250 | 2250 | 2250 |
| 8 | | | | | | NOT TESTED | | | | | | | | |
| 12 | 2250 | 2250 | 2250 | 2250 | 2250 | 2250 | 2250 | 2250 | 2250 | * | 2250 | 2250 | 2250 | 2250 |
| | | | | | | Plate 3 | | | | | | | | |
| 4 | 1200 | 1400 | 1600 | 2100 | 2000 | 1500 | 1300 | 1200 | 1500 | 1000 | 1500 | 1800 | 1900 | 2000 |
| 8 | 1100 | 1400 | 1900 | 2000 | * | 1400 | 1900 | 1800 | 1900 | 1300 | 1500 | 1900 | 2200 | 2000 |
| 12 | 1200 | 1600 | 2000 | 1800 | 2250 | 1200 | 1300 | 1600 | 1700 | 1000 | 1500 | 1600 | 2000 | 2200 |

*Could Not Be Read.

It was further noted that burn marks were observed on Plates 1 and 3 where breakdown occurred, and that on Plate 2 the applied voltage reached 4000 volts before breakdown, except as noted in the table.

MECHANICAL TESTING EXAMPLE

A module package in accordance with the preferred embodiment heretofore described having a solar cell assembly 12 inches by 13 inches by 0.09 inch, a layer of asphaltic material 0.06 inch thick and an aluminum plate second support member 0.125 inch thick, was mounted on a commercial fence charger. The charger with attached module package was dropped on its back side and on its glass front from a height of approximately 3½ feet onto snow covered grass and onto concrete seven times without any evidence of breakage. Therefore, the module package successfully passed the desired mechanical testing. The module finally failed upon being dropped as described on its edge, with one corner being severely bent and the module broke loose from the package/charger unit.

While a particular embodiment of the solar cell module package and the method of its preparation of the present invention has been shown and described, it will be appreciated by those skilled in the art that changes and modifications may be made thereto without departing from the invention in its broader aspects and as set forth in the following claims.

We claim:

1. A solar cell module package comprising:

a light-transmissive glass support member;

at least one amorphous silicon solar cell comprising a member selected from the group consisting of amorphous silicon and amorphous silicon alloy, secured to said glass support member, said amorphous silicon solar cell comprising a p-type doped layer, an n-type doped layer, an intrinsic layer disposed between said p-type doped layer and said n-type doped layer, a tin oxide conductive layer positioned between said glass support member and said p-type doped layer, and a back contact layer positioned away from said n-type doped layer;

a protective composite layer positioned adjacent said back contact layer of said amorphous silicon solar cell, said protective composite layer comprising a polymeric material and asphalt, said polymeric material being selected from the group consisting of polymeric mesh, a polymeric web, and a polymeric sheet; and a metal support member positioned adjacent said protective composite layer; and said protective composite layer being disposed between said amorphous silicon solar cell and said metal support member.

2. The solar cell module package of claim 1, wherein said protective composite layer includes an adherent surface positioned against said solar cell.

3. The solar cell module package of claim 1, wherein said protective composite layer comprises a polymeric web and said asphalt is bonded to and supported by said web.

4. The solar cell module package of claim 1 wherein said protective composite layer comprises a polymeric mesh with interstices and said asphalt is positioned in said interstices and secured to said polymeric mesh.

5. The solar cell module package of claim 1 including a barrier coating for said amorphous silicon solar cell positioned adjacent said protective composite layer.

6. The solar cell module package of claim 1 including metal frame members for substantially retaining and securing said amorphous silicon solar cell and said protective composite layer, said frame means being secured to one of said support members.

7. A solar cell module package comprising:

a glass support member;

a solar cell positioned adjacent said glass support member;

a composite-polymeric layer adjacent the surface of said solar cell opposite the glass support member comprising a polymeric material and asphalt, said polymeric material being selected from the group consisting of polymeric mesh, a polymeric web, and a foraminous polymeric sheet;

a metal support member positioned in proximity to said composite polymeric layer and at least partially coextensive therewith; and frame members for substantially retaining and supporting said solar cell, said composite polymeric layer and at least one of said support members.

8. A method for preparing a solar cell module package having at least one solar cell positioned between a glass support member and a metal support member, comprising:

interposing a composite polymeric layer of polymeric material and asphalt between said solar cell and said metal support member, said composite polymeric layer being positioned in proximity to said solar cell and said metal support member, said composite polymeric layer being positioned in proximity to said solar cell and adjacent said metal support member to form said package; and curing said package by heating said composite polymeric layer to a temperature above about 60° C. and below about 150° C. for a time sufficient to at least soften said composite layer and provide a seal for said solar cell against environmental elements.

9. The method of claim 8, wherein the package is cured by heating said package to said temperature for approximately 15 minutes.

10. The method of claim 8, further comprising placing a barrier coating on a surface of said solar cell prior to said interposing step, and interposing said composite polymeric layer between the barrier coating and said metal support member prior to said curing step.

11. The method of claim 8, wherein said interposing comprises laying a web of polymeric material supporting asphalt upon a back contact on said solar cell.

12. The method of claim 8 including coating a polymeric mesh with asphalt to form said composite polymeric layer.

13. The method of claim 8 wherein said solar cell comprises an amorphous silicon solar cell comprising a member selected from the group consisting of amorphous silicon and amorphous silicon alloy, and said amorphous silicon solar cell is formed by a procedure comprising a step selected from the group consisting of glow discharge, sputtering, and chemical vapor deposition.

\* \* \* \* \*